United States Patent [19]

Takeda et al.

[11] Patent Number: 4,876,119
[45] Date of Patent: Oct. 24, 1989

[54] METHOD OF COATING A NITRIDE CERAMIC MEMBER

[75] Inventors: Hiromitsu Takeda; Masako Nakahashi; Makoto Shirokane; Tatsuo Yamazaki, all of Tokyo, Japan

[73] Assignee: Kabushiki Kaisha Toshiba, Kawasaki, Japan

[21] Appl. No.: 167,237

[22] Filed: Mar. 11, 1988

[30] Foreign Application Priority Data

| Mar. 13, 1987 | [JP] | Japan | 62-56850 |
| Mar. 13, 1987 | [JP] | Japan | 62-58103 |
| Mar. 13, 1987 | [JP] | Japan | 62-58104 |

[51] Int. Cl.⁴ .............................................. C23C 16/00
[52] U.S. Cl. .................................. 427/250; 427/126.2; 427/255; 427/214; 427/307; 427/309
[58] Field of Search ............... 427/250, 255, 294, 307, 427/309, 126.2, 255.4

[56] References Cited

U.S. PATENT DOCUMENTS

| 4,406,667 | 9/1983 | Sarin et al. | 427/215 |
| 4,654,232 | 3/1987 | Sayano | 427/377 |
| 4,678,678 | 7/1987 | Kamigaito et al. | 427/250 |
| 4,685,607 | 8/1987 | Takeda et al. | 228/193 |

FOREIGN PATENT DOCUMENTS

| 0162700 | 6/1979 | European Pat. Off. |
| 3233087 | 3/1984 | Fed. Rep. of Germany | 427/250 |

OTHER PUBLICATIONS

Chemical abstracts, vol. 106, no. 10, Mar. 1987, p. 309, abstract No. 71895p, Columbus, Ohio, U.S.; & JP-A-61 209 979 (Toshiba Corp.) 9-18-1986.
Chemical Abstracts, vol. 100, No. 8, Feb. 1984, p. 268, abstract no. 55907q, Columbus, Ohio U.S.; & JP-A-58 176 189 (NGK Spark Plug Co., Ltd) 10-15-1983.
Chemical Abstracts, vol. 88, 1978, p. 311, abstract no. 157371m, Columbus, Ohio, U.S.; & JP-A-77 29 246 (Agency of Industrial Sciences and Technology) 8-01-1977.

*Primary Examiner*—Stanley Silverman
*Attorney, Agent, or Firm*—Oblon, Spivak, McClelland, Maier & Neustadt

[57] ABSTRACT

A nitride ceramic member is maintained at a vacuum of $1 \times 10^{-4}$ Torr or less at a temperature of 1,000° C. or more, and a metal vapor is brought into contact with the surface of the nitride ceramic member. A nitride is reacted with the metal in the surface portion of the ceramic member, and a metallized layer is formed on the surface of the member. If AlN is used as a nitride ceramic material, the AlN member is maintained at the vacuum at the high temperature and a Ti vapor is brought into contact wit the surface of the AlN member to form a TiN coating layer on the surface of the AlN member. A BN or graphite mask is formed on the surface of the nitride ceramic member and the above method is practiced to selectively form a metallized layer on the non-masked member surface. By selectively forming a metallized layer by using AlN, a highly thermal-conductivity substrate having a conductive layer formed on the AlN base can be prepared.

18 Claims, 1 Drawing Sheet

METHOD OF COATING A NITRIDE CERAMIC MEMBER

BACKGROUND OF THE INVENTION

1. Field of the Invention.

The present invention relates to a method of coating for a nitride ceramic member such as silicon nitride, aluminum nitride or the like.

2. Description of the Related Art.

Since ceramic materials have good properties such as mechanical and chemical properties, these materials have been popular in a wide application range of structural materials and functional materials. In many applications, components consist of only ceramic materials. However, in order to utilize ceramic materials in a still wider application range, metals must be bonded to ceramic members. A conventional method of effectively bonding a ceramic member and a metal is a method of metallization for a ceramic member as follows.

First, a powder containing Mo or W as a major constituent is applied to a surface of a ceramic base, heated at 1,400° to 1,700° C. in a reducing atmosphere, and reacted with Mo or W to achieve metallization.

Second, an Au or Pt film is placed on a surface of a ceramic base and heated while the film is compressed, thereby achieving metallization of the ceramic base.

Although the first method is suitable when $Al_2O_3$ is used as a base material, an adhesion force with the metal is weak in a nitride ceramic material (e.g., aluminum nitride (AlN) or silicon nitride ($Si_3N_4$) which has recently received a great deal of attention as a high-performance ceramic material.

According to the second method, an expensive noble metal is used to cause an economical disadvantage. In addition, a high pressure is required to improve adhesion strength between the base and the metal. Therefore, the second method is not suitable for metallization of a member which is not to be deformed.

A direct metallization method for a member consisting of a nitride ceramic such as $Si_3N_4$ is proposed (U.S. Pat. No. 4,685,607). This method utilizes slight decomposition of $Si_3N_4$ at a high temperature. For example, a metal powder which is easily alloyed with Si is sprayed or coated on a surface of an $Si_3N_4$ member and is heated at a temperature of 1,150° C. or higher and a pressure of $5 \times 10^{-4}$ Torr or less to form a metallized layer. More specifically, on the surface of the $Si_3N_4$ member, Si produced by decomposition of $Si_3N_4$ is diffusion-reacted with the metal coated on the surface of the $Si_3N_4$ member, and a liquid phase spreads due to a decrease in melting point by the diffusion reaction. As a result, a metallized layer consisting of an alloy of Si and the sprayed or coated metal is formed.

According to this method, however, it is difficult to control the grain size and thickness of the metal powder sprayed or coated on the surface of the $Si_3N_4$ member. An excess amount of the metal powder is often present on the surface of the $Si_3N_4$ member. If the excess amount of the metal powder is present on the surface of the $Si_3N_4$ member, the thickness of the metallized layer is increased. A large thermal stress is generated during cooling of the metallized layer from the metallizing temperature to room temperature, and the $Si_3N_4$ member may be cracked.

AlN as another typical nitride ceramic material has received a great deal of attention as a semiconductor device substrate due to a high thermal conductivity. In this case, bonding of AlN with a conductive material is indispensable. A metal which is easily alloyed with Al is sprayed on the surface of the AlN member and is heated at a temperature of 1,150° C. or higher and a pressure of $5 \times 10^{-4}$ Torr or less in the same manner as in $Si_3N_4$.

When the above method is employed, the following disadvantage is caused. Since an amount of Al produced by decomposition on the surface of the AlN member is very small, a diffusion reaction between Al and the sprayed or coated metal does not easily occur. It is therefore difficult to form a metallized layer having a sufficient thickness. An attempt has been made to decompose AlN in a sufficient amount at a temperature of 1,500° C. or higher. When the decomposition is performed at such a high temperature, the sprayed or coated metal is converted into a liquid phase to cover the surface of the AlN member. Production of Al by AlN decomposition is interfered to disable formation of the metallized layer.

TiN as a conductive ceramic material has recently received a great deal of attention as a conductive material formed on an AlN substrate. Since TiN is a ceramic material, it has a thermal expansion coefficient equivalent to that of AlN unlike a metal used for metallization. TiN has a small thermal stress acting on AlN, resulting in convenience. Chemical vapor deposition (CVD) or physical vapor deposition (PVD) can be used as a method of coating TiN on AlN. However, TiN is only mechanically adhered to the surface of AlN. Therefore, a sufficient adhesion strength cannot be obtained, and the obtained metallized layer does not have a satisfactory function.

SUMMARY OF THE INVENTION

It is an object of the present invention to provide a method of coating for a nitride ceramic material wherein a uniform, thin coated layer can be formed on a surface layer of a nitride ceramic member, thermal stress generated in the metallized layer can be minimized, and a high adhesion strength between the nitride ceramic member and the coated layer can be obtained.

It is another object of the present invention to provide a method of coating TiN on an AlN member with a high adhesion strength.

It is still another object of the present invention to provide a highly thermal-conductive substrate having high adhesion strength between AlN and a high-quality conductive layer.

According to an aspect of the present invention, there is provided a method of coating for a nitride ceramic member, comprising the steps of: activating a surface of the nitride ceramic member in a vacuum at a high temperature; and bringing a metal vapor into contact with the surface of the nitride ceramic member to from a metallized layer on the surface of the nitride ceramic member.

According to another aspect of the present invention, there is provided a method of coating TiN on AlN, comprising the steps of: activating a surface of an AlN member in a vacuum at a high temperature; and bringing a Ti vapor or a vapor containing Ti into contact with the AlN member to form a TiN layer on the surface of the AlN member.

According to still another aspect of the present invention, there is provided a substrate having a high thermal conductivity, comprising: an AlN base having a conductive layer formation region on a surface thereof; and a conductive layer formed such that a substrate surface region excluding the conductive layer formation region is masked, the AlN substrate is held in a vacuum at a high temperature to activate the conductive layer formation region and a metal vapor is brought into contact with this conductive layer formation region.

According to the present invention, the above nitride ceramic member is held in a vacuum at a high temperature to activate its surface. In this state, a metal vapor is brought into contact with the activated surface of the nitride ceramic member. Nitride atoms in the ceramic member surface are reacted with the evaporated metal atoms to form a metallized layer on the surface of the nitride ceramic member. If AlN is used as a nitride ceramic material, the surface of the AlN member is held in a vacuum at a high temperature to activate the surface, and a Ti vapor is brought into contact with the AlN member surface. AlN is decomposed on the surface of the AlN member surface to cause N to react with Ti, thereby forming a TiN coating layer on the surface of the AlN member.

In this manner, the nitride ceramic member is reacted with the metal vapor to form a metallized or coating layer. Adhesion strength between the nitride ceramic member and the metallized or coating layer is excellent. Since the metal reacted with the nitride ceramic material is a vapor state, a thin, uniform metallized layer can be formed. Therefore, the thermal stress rarely acts on the nitride ceramic member. Even if an amount of decomposed nitride is small, the reaction between the nitride ceramic member and the metal can be accelerated, and the metallized or coating layer can be effectively formed.

By forming a conductive layer on the AlN base according to the invention, a substrate having a high thermal conductivity which has good properties and a simple structure can be formed.

DETAILED DESCRIPTION OF THE PREFERRED EMBODIMENT

Figure 1:
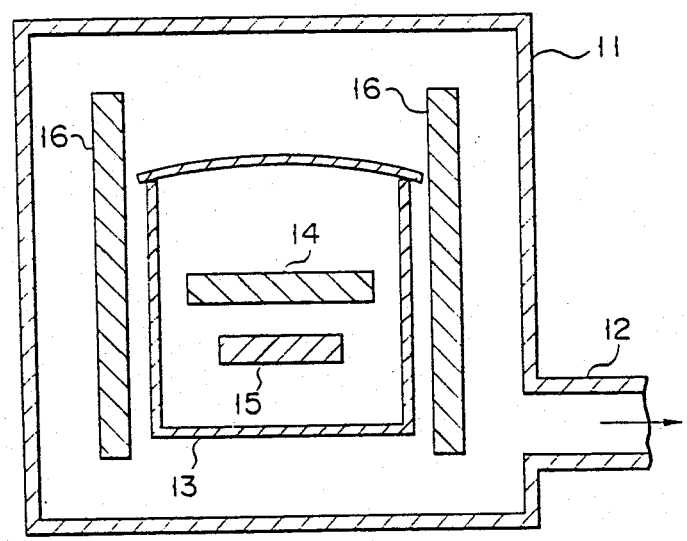
FIG. 1 is a sectional view showing an apparatus for practicing a method of metallization for a nitride ceramic member according to the present invention.

The present invention will be described in detail. A nitride ceramic member is held in a vacuum at a high temperature so as to activate its surface. A metal vapor to be a constituting element of a metallized layer is brought into contact with the member surface to form a metallized layer. In this case, $Si_3N_4$ or AlN can be used as a nitride ceramic material. The pressure and temperature conditions for the nitride ceramic member are given as follows: a temperature is 1,100° C. or higher; and a pressure is $1 \times 10^{-4}$ Torr or less. Under these conditions, the surface of the nitride ceramic member can be sufficiently activated.

A metal to be evaporated and brought into contact with the surface of the nitride ceramic member is Ni, Fe, Cu, or an alloy thereof (e.g., an Ni-Al alloy or an Ni-Cr alloy). These materials can be reacted with precursor to nitride of the activated nitride ceramic member surface held in a vacuum at a high pressure, and alloying allows to form a metallized layer.

The techniques used for bringing the metal vapor, constituting a metallized layer, into contact with the surface of the nitride ceramic member includes: (1) a technique in which a nitride ceramic member is placed in a chamber, a metal powder or a metal mass is placed to be separated from the ceramic member in the chamber, and the interior of the chamber is held in a vacuum at a high temperature to expose the nitride ceramic member to a metal vapor atmosphere; and (2) a metal vapor produced by the reaction between a metal salt (e.g., a metal chloride) and a reducing agent (e.g., hydrogen) is introduced to a chamber held in a vacuum at a high temperature, and the nitride ceramic member in the chamber is exposed to a metal vapor atmosphere. With these techniques, the metal vapor can be effectively brought into contact with the activated surface of the nitride ceramic member.

Assume that AlN is used as a nitride ceramic material, that the AlN is held in a vacuum at a high temperature to activate its surface, and that Ti or an Ti alloy (e.g., Ti-6A—4 V) is used as a metal in the form of a vapor to be brought into contact with the surface of the AlN member. N atoms in the surface of the AlN member are reacted with Ti atoms to form a TiN coating layer. In this case, a reaction pressure is preferably $5 \times 10^{-5}$ Torr or less. If the pressure is higher than $5 \times 10^{-5}$ Torr, evaporation of the metal may be interfered. If a heating temperature falls within the range of 1,100° to 1,400° C. and a heating time falls within the range of 0.1 to 15 hours, a preferable coating layer having a thickness of about 0.5 to 10 $\mu m$ can be formed. Since TiN has a thermal expansion coefficient more similar to that of AlN than that of a metal, the heat stress between these materials is very small. In addition, since TiN is electrically conductive, the coating layer can be used as a conductive layer. The TiN-coated AlN member can be used as an electronic element. The TiN layer can be electroplated. Since the TiN layer can be easily brazed, can be bonded with a metal member. Furthermore, since TiN is golden in color, it can also be used for a decorative purpose.

An arrangement of an apparatus for practicing the method of the present invention will be described with reference in FIG. 1. Reference numeral 11 denotes a vacuum housing. Exhaust port 12 is formed in the lower side wall portion of the housing, and housing 11 is evacuated by an evacuating device (not shown) through exhaust port 12. Reaction chamber 13 is defined in vacuum housing 11. Nitride ceramic member 14 opposes metal plate 15 in chamber 13. Nitride ceramic member 14 is spaced apart from metal plate 15 by a proper distance (e.g., 5 mm). Heater 16 is disposed around reaction chamber 13 in vacuum housing 11.

In order to form a metallized layer on a nitride ceramic member surface in the apparatus described above, vacuum housing 11 is evacuated by an evacuating means to a vacuum of $1 \times 10^{-4}$ Torr or less. Vacuum housing 11 is heated to a temperature of 1,100° C. or higher by heater 16. The surface layer of the metal plate in reaction chamber 13 is evaporated to obtain a metal vapor atmosphere in reaction chamber 13. Since the surface of nitride ceramic member 14 is activated, the precursor to nitride in the member surface are reacted with the metal vapor to form a metallized layer on member 14.

A method of partially forming a metallized layer on the nitride ceramic member surface by using the above method will be described below. In this case, a material excluding BN is used as a nitride ceramic material. A BN or graphite coating is formed in a portion except for a metallized layer formation region on the surface of the nitride ceramic member to mask the region for non-metallization. A means for forming the above coating is a method of spraying a mixture slurry of a BN or graphite powder and a solvent, or a method of coating a slurry prepared by adding a binder or the like to the above slurry so as to increase its viscosity. The nitride ceramic member is held in a vacuum at a high temperature to activate only the metallized layer formation region on the surface, and a metal vapor is brought into contact with this region. As a result, a metallized layer is formed on only the metallized layer formation region of the nitride ceramic member.

The metallized layer is not formed in the masking region because BN and graphite are chemically inactive and the BN or graphite coating functions as a barrier for the underlying nitride ceramic member. The BN or graphite coating is exemplified as a masking coating. However, the masking coating is not limited to a specific one, but can be replaced with any material which is chemically inactive.

When such a selective metallized layer is formed, the apparatus shown in FIG. 1 can be basically used. The above technique can also be used to coat TiN on the AlN member.

Figure 2:
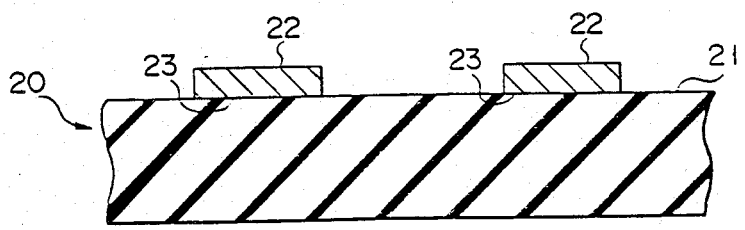
FIG. 2 is a sectional view showing a substrate having a high thermal conductivity.

A highly thermal-conductive substrate which is prepared by applying the above selective metallization method will be described below. AlN is suitable for a structural material due to its high rigidity. In addition to this advantage, AlN has an extremely high thermal conductivity. Therefore, AlN is suitable for a base material for a power semiconductor module substrate. As shown in FIG. 2, conductive layer 22 is formed on conductive layer formation region 23 of AlN base 21 in accordance with the above technique for selectively forming a metallized layer, thereby substrate 20 having a high thermal conductivity can be formed. A semiconductor element may be mounted on conductive layer 22 by soldering. In this case, a metal to be evaporated in Fe, Ni, Cu, Ti, or an alloy thereof. When Fe, Ni, Cu, or an alloy thereof is used, Ni-Al alloy, Fe-Al alloy on Cu-Al alloy as conductive layer 22 is formed on AlN base 21. In this case, Al content of conductive layer 22 is not more than 1% by weight. When Ti or a Ti alloy is used, TiN as conductive layer 22 is formed on AlN base 21, as described above. A Cu heat sink is used in a conventional power semiconductor module substrate in order to maintain good heat dissipation. When an insulating substrate is bonded to this heat sink, a very complicated structure is required. However, a substrate prepared by the method of the present invention has a simple structure, and sufficient heat dissipation can be achieved due to the presence of AlN. In a practical application, a plated layer may be formed on conductive layer 22 and a semiconductor element may be formed on the plated layer. A metal for the plated layer is Au, Ag, Cu, or an alloy thereof.

The present invention will be described in detail by way of its examples.

EXAMPLE 1

A 30 mm×30 mm×3 mm $Si_3N_4$ plate was prepared and was placed in an alumina crucible such that it was separated from a 1-mm thick Ni plate by a distance of 5 mm. An alumina lid was placed in an upper opening of the crucible. The crucible was placed in a vacuum furnace. The vacuum furnace was evacuated to a vacuum of $1 \times 10^{-6}$ Torr or more and was heated to 1,250° C. The vacuum furnace was maintained at this temperature for 3 hours.

After the furnace was cooled, the crucible was removed from the vacuum furnace and the $Si_3N_4$ plate was removed from the crucible. It was checked that a uniform, thin metallized layer was formed on the surface of the $Si_3N_4$ plate. The $Si_3N_4$ plate was cut into pieces and the cross section of it was observed. The thickness of the metallized layer was 1.5 μm. In addition, it was found by X-ray diffraction that the metallized layer consisted of an Ni-Si alloy. This indicates that the surface layer is not simply deposited on the surface of the $Si_3N_4$ plate but that Ni atoms are reacted with $Si_3N_4$ to form a metallized layer.

EXAMPLE 2

A 30 mm×30 mm×3 mm AlN plate was prepared and was placed in an alumina crucible such that it was separated from a 1-mm thick Ni plate by a distance of 5 mm. An alumina lid was placed in an upper opening of the crucible. The crucible was placed in a vacuum furnace. The vacuum furnace was evacuated to a vacuum of $1 \times 10^{-6}$ Torr or more and was heated to 1.250° C. The vacuum furnace was maintained at this temperature for 3 hours.

After the furnace was cooled, the crucible was removed from the vacuum furnace and the AlN plate was removed from the crucible. It was checked that a uniform, thin metallized layer was formed on the surface of the AlN plate. The AlN plate was cut and the cross section of it was observed. The thickness of the metallized layer was 1.5 μm. In addition, it was found by X-ray diffraction that the metallized layer consisted of an Ni-Al alloy. This indicates that the surface layer is not simply deposited on the surface of the AlN plate but that Ni atoms are reacted with AlN to form a metallized layer.

EXAMPLE 3

An AlN disc plate having a diameter of 100 mm and a thickness of 2 mm was prepared and was placed in an alumina crucible in which a Ti plate of JIS Class 3 was placed in its bottom. An alumina lid was placed on the upper opening of the crucible. The crucible was placed in a vacuum furnace. The vacuum furnace was evacuated to a vacuum of $1 \times 10^{-6}$ Torr or more and was heated to 1,250° C. The vacuum furnace was maintained at this temperature for 3 hours. After the furnace was cooled, the crucible was removed from the vacuum furnace and the AlN plate was removed from the crucible. It was checked that a uniform, thin metallized layer was formed on the surface of the AlN plate. The AlN plate was cut and the cross section of it was observed. The thickness of the metallized layer was measured to be 3 μm. In addition, it was found by X-ray diffraction that the metallized layer consisted on TiN. This indicates that the surface layer is not simply deposited on the surface of the AlN plate but that Ti atoms are reacted with AlN to form a metallized layer.

EXAMPLE 4

An AlN disc plate having a diameter of 100 mm and a thickness of 2 mm was prepared and was placed in an alumina crucible and was separated from 98% Ti powder by a distance of about 5 mm in the crucible. An alumina lid was placed on the upper opening of the crucible. The crucible was placed in a vacuum furnace. The vacuum furnace was evacuated to a vacuum of $1\times10^{-6}$ Torr or more and was heated to 1,200° C. The vacuum furnace was maintained at this temperature of 3 hours. After the furnace was cooled, the crucible was removed from the vacuum furnace and the AlN plate was removed from the crucible. It was checked that a uniform, thin metallized layer was formed on the surface of the AlN plate. The AlN plate was cut and the cross section of it was observed. The thickness of the metallized layer was measured to be about 0.5 μm. In addition, it was found by X-ray diffraction that the metallized layer consisted in TiN. This indicates that the surface layer is not simply deposited on the surface of the AlN plate but that Ti atoms are reacted with AlN to form a metallized layer.

EXAMPLE 5

A 30 mm×30 mm×3 mm $Si_3N_4$ plate was prepared, and a slurry of a BN powder, an organic binder, and a solvent was sprayed to a desired portion of the $Si_3N_4$ plate to form a 0.1-mm thick coating containing BN as a major constituent. The resultant $Si_3N_4$ plate was placed in an alumina crucible in which a 1-mm thick Ni plate was placed. The $Si_3N_4$ plate was separated from the Ni plate by a distance of about 5 mm. An alumina lid was placed in the upper opening of the crucible. The crucible was placed in a vacuum furnace. The vacuum furnace was evacuated to a vacuum of $1\times10^{-6}$ Torr or more and was heated to a temperature of 1,250° C. The vacuum furnace was kept at this temperature for 3 hours.

After the vacuum furnace was cooled, the crucible was removed from the vacuum furnace and the $Si_3N_4$ plate was removed from the crucible. It was found that a uniform, thick metallized layer was selectively formed in a surface portion excluding the BN pattern region of the $Si_3N_4$ plate. The $Si_3N_4$ plate was cut and the cross section of it was observed. The thickness of the metallized layer was 1.5 μm. In addition, it was found by X-ray diffraction that the metallized layer consisted of an Ni-Si alloy. BN was easily removed from the surface of the $Si_3N_4$ plate.

EXAMPLE 6

A thin, uniform metallized layer was selectively formed in a surface excluding a BN pattern region of an AlN plate, following the same procedures as in Example 5 except that an AlN plate having the same size as that of the $Si_3N_4$ plate was used. It was found that the metallized layer consisted of an Ni-Al alloy.

EXAMPLE 7

A 0.1-mm thick graphite film was formed by fine particle graphite spray AERODACK G (tradename) available from Nihon Atison K.K. on a surface portion of an AlN plate having a predetermined shape, except for a portion in which various electronic circuits were mounted and a prospective conductive layer formation region. The resultant AlN plate was placed in an alumina crucible in which a 1-mm thick Ni plate was placed. The AlN plate was separated from the Ni plate by a distance of about 5 mm. An alumina lid was plated in the upper opening of the crucible. The crucible was placed in a vacuum furnace and the vacuum furnace was evacuated to a vacuum of $2\times10^{-5}$ Torr. The vacuum furnace was heated at a rate of 15° C./min and was kept at a temperature of 1,250° C. for 2 hours.

After the vacuum furnace was cooled, the crucible was removed from the vacuum furnace and the AlN plate was removed from the crucible. The AlN plate was washed with acetone. A desired electronic circuit consisting of an Ni-Al alloy slightly containing Al was found to be formed on the surface. An electronic component including a power transistor and the like has mounted on the resultant circuit board through a solder, thereby preparing a highly reliable semiconductor module having a high thermal conductivity.

EXAMPLE 8

A 0.3-mm thick stainless steel mask having a predetermined shape and corresponding to a conductive layer formation region of a power module was placed on an AlN base surface, and BN was sprayed by a BN spray Lu BN (tradename) in a portion which did not require formation of the conductive layer, thereby forming an inactive layer. Thereafter, the stainless steel mask was removed from the AlN base. The resultant AlN base was placed in an alumina crucible. An Ni plate was placed in the crucible and was separated from the base by a distance of about 5 mm. The alumina crucible was placed in a vacuum furnace, and the vacuum furnace was evacuated to a vacuum of $2\times10^{-5}$ Torr. The vacuum furnace was heated to 1,230° C. and was kept at this temperature for 3 hours. After the vacuum furnace was cooled, the base was taken out from the vacuum furnace and was washed with an ultrasonic wave in acetone. The BN-sprayed region of the AlN base was exposed, and an Ni-Al alloy conductive layer was formed in the region excluding the BN-sprayed region. Semiconductor elements were soldered on the conductive layer to prepare a semiconductor module. The thermal conductivity of the semiconductor module was 120 W/(m·k) and was increased to about 10 times that obtained when an $Al_2O_3$ substrate was used. Since this conductive layer was formed by the chemical reaction between AlN and Ni, their bonding strength was excellent and the layer could sufficiently withstand a heat cycle of room temperature to 200° C.

EXAMPLE 9

After a 0.3-mm thick stainless steel mask having a predetermined shape corresponding to a conductive layer formation region of a power module was placed on the surface of an AlN base as in Example 8, graphite AQUADACK (tradename) was sprayed on the surface of the base in a portion which did not require formation of the conductive layer, thereby forming an inactive layer. Thereafter, the stainless steel mask was removed from the AlN base, and the resultant AlN base was placed in an alumina crucible. A Ti plate was placed in the crucible and was spaced apart from the base by a distance of about 5 mm. The alumina crucible was placed in a vacuum furnace and the vacuum furnace was evacuated to a vacuum of about $2\times10^{-5}$ Torr. The vacuum furnace was heated to 1,180° C. and was kept at this temperature for 1.5 hours. After the vacuum furnace was cooled, the base was taken out from it. The base was washed with an ultrasonic wave in acetone and was observed. Surface of AlN was exposed on the graphite-sprayed reason, and the remaining region was covered with a TiN conductive layer. The conductive layer was Cu-plated and semiconductor elements were soldered to the conductive layer, thereby preparing a semiconductor module. The thermal conductivity of the semiconductor module was 115 W/(m·k) as in Example 8 and its characteristics as the semiconductor module were the same as those in Example 8.

What is claimed is:

1. A method of coating a nitride ceramic member, comprising the steps of:
   activating a surface of said nitride ceramic member by subjecting the member to a high temperature in a vacuum; and
   bringing a metal vapor, which is reactable with an element present in the nitride ceramic member, into contact with the activated surface of the nitride ceramic member to form a layer thereon comprised of a reaction product of an element present in the nitride ceramic member and the metal vapor, on the activated surface.

2. The method according to claim 1, wherein the nitride ceramic member contains a material selected from the group consisting of $Si_3N_4$ and AlN.

3. The method according to claim 1, wherein the metal vapor contains a material selected from the group consisting of Ni, Fe, Cu, and an alloy thereof.

4. The method according to claim 1, wherein the nitride ceramic member is maintained at a temperature of not less than 1,100° C. in the activation of said surface.

5. The method according to claim 1, wherein the nitride ceramic member is maintained at a pressure of not more than $1 \times 10^{-4}$ Torr in the activation of said surface.

6. The method according to claim 1, wherein the step of activating the surface is performed in a vessel where the nitride ceramic member is placed.

7. The method according to claim 6, wherein a metal powder or metal mass is spaced apart from the nitride ceramic member by a predetermined distance in the vessel, and the metal powder of metal mass is kept together with the nitride ceramic member in a vacuum at a high temperature to produce the metal vapor.

8. The method according to claim 6, wherein a metal salt and a reducing agent are reacted with each other in the vessel and the metal vapor is introduced into the vessel to form the metallized layer.

9. A method according to claim 1, wherein the inactive layer contains a material selected from the group consisting of BN and graphite.

10. The method according to claim 1, wherein said nitride ceramic member is AlN, said metal vapor contains Ti and said coated layer which is formed is TiN.

11. The method according to claim 10, wherein the AlN member is maintained at a temperature falling within a range of 1,100° C. to 1,400° C. in the activation of the surface.

12. The method according to claim 10, wherein the AlN member is maintained at a pressure of not more than $5 \times 10^{-5}$ Torr in the activation of the surface.

13. The method according to claim 10, wherein the step of activating the surface is performed in a vessel where the AlN member is placed.

14. The method according to claim 13, wherein a powder or mass of Ti or a Ti alloy is placed in the vessel and is spaced apart from the AlN member by a predetermined distance, and the Ti or Ti alloy is kept together with the AlN member at a vacuum at a high temperature, thereby producing a Ti vapor or a vapor containing Ti.

15. The method according to claim 13, wherein the Ti vapor or the vapor containing Ti which is prepared by reacting a salt and a reducing agent is introduced into the vessel to form the coating layer.

16. The method according to claim 10, further comprising the step of forming an inactive layer in an AlN member surface region excluding the coating layer formation region.

17. The method according to claim 10, wherein the inactive layer contains a material selected from the group consisting of BN and graphite.

18. The method according to claim 1, which further comprises:
   forming an inactive layer on the surface of said nitride ceramic member of a nitride material other than BN except for a portion of said surface which is identified as a coated layer formation region, and
   applying a metal to said coated layer formation region from a metal vapor thereby forming said coated layer on said region only.

* * * * *